United States Patent [19]
Park

[11] Patent Number: 5,495,449
[45] Date of Patent: Feb. 27, 1996

[54] SEMICONDUCTOR MEMORY DEVICE

[75] Inventor: Jong H. Park, Kyungki-Do, both of Rep. of Korea

[73] Assignees: Goldstar Electron Co., Ltd., Choongchungbook-Do; Kyung Y. Kim, Seoul, both of Rep. of Korea

[21] Appl. No.: 368,453

[22] Filed: Jan. 4, 1995

[30]     Foreign Application Priority Data

Nov. 24, 1994 [KR] Rep. of Korea ............... 31025/1994

[51] Int. Cl.$^6$ ................................................. G11C 7/00
[52] U.S. Cl. .................. 365/203; 365/233.5; 365/190; 365/207
[58] Field of Search .................................. 365/203, 204, 365/207, 208, 233.5, 190

[56]             References Cited

U.S. PATENT DOCUMENTS

| | | | |
|---|---|---|---|
| 5,043,945 | 3/1991 | Bader | 365/203 |
| 5,091,889 | 2/1992 | Hamano et al. | 365/233.5 |
| 5,121,356 | 6/1992 | Park et al. | 365/203 |
| 5,428,574 | 6/1995 | Kuo et al. | 365/203 |

Primary Examiner—Tan T. Nguyen
Attorney, Agent, or Firm—Lowe, Price, LeBlanc & Becker

[57]            ABSTRACT

The present invention discloses a semiconductor memory device. The device comprises memory cells for storing data, bit line pairs connected to the memory cells and for transmitting the data, data line pairs for transmitting the data to the bit line pairs, column select transistors for controlling transmission of the data between the bit line pairs and the data line pairs, precharging transistors for precharging the data line pairs, an address state transition detecting means for generating an address state transition detection pulse by detecting state transition of an address signal, a data state transition detection means for generating a data state transition detection pulse by detecting state of the data, a control circuit for enabling the precharging transistors in response to the address state transition detection pulse, the data state transition detection pulse, and a write enable signal, thereby protecting an entry of invalid data by ensuring enough write recovery time and data hold time.

1 Claim, 4 Drawing Sheets

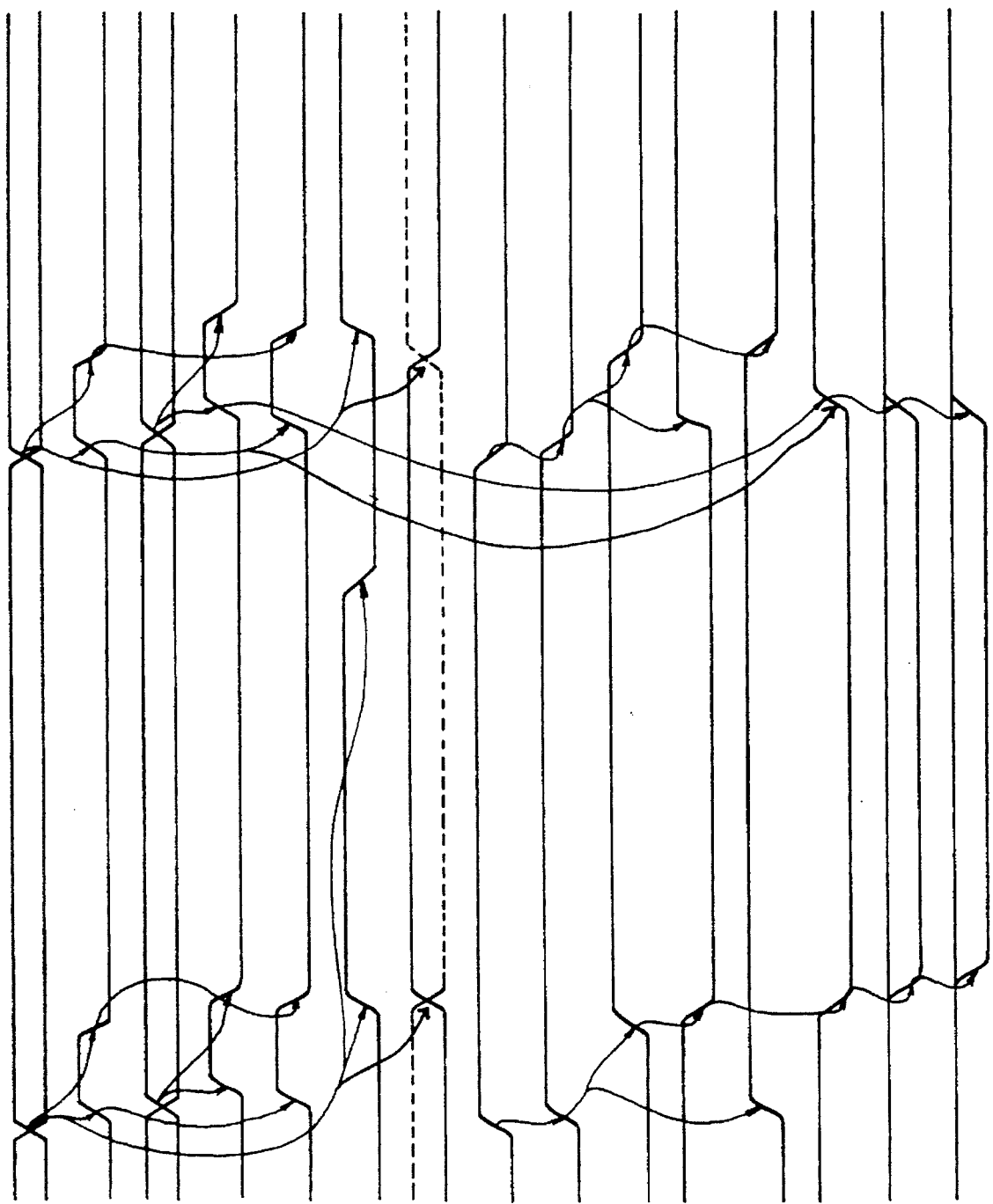
FIG. 4A ADD
FIG. 4B ATDSUM
FIG. 4C DIN
FIG. 4D DTDSUM
FIG. 4E EQN
FIG. 4F WL
FIG. 4G CS
FIG. 4H WE
FIG. 4I N10
FIG. 4J N11
FIG. 4K N12
FIG. 4L CWE
FIG. 4M CIEB
FIG. 4N DL/DLB
FIG. 4N BL/BLB

SEMICONDUCTOR MEMORY DEVICE

BACKGROUND OF THE INVENTION

1. Field of the Invention

The present invention relates to a semiconductor memory device, and more particularly, to a semiconductor memory device which includes a circuit for separately generating a bit line equalize signal and bit line precharge signal and separately supplying them to the corresponding bit lines for a memory cell and a circuit for preventing an entry of write data from being made, for a predetermined period of time, by a resetting operation and ensures an adequate operation margin against a data hold time.

2. Description of the Prior Art

In a conventional semiconductor memory device, a precharge and equalize signals generating circuit is connected to memory cells to generate a precharge signal for precharging the corresponding memory cell and an equalize signal for equalizing the corresponding memory cell. In this semiconductor memory device, an ideal design is sought to achieve a write recovery time be equal to zero. In this state, the precharge/equalize signal is generated to hold the bit line potential at a high(Vcc-Vth) potential level.

However, in the conventional semiconductor memory device, even in the event of a transition to an address of the next cycle during the data write operation, a high potentials appear on the paired bit lines during the generation of a precharge and equalize signals, no write error occurs, but at the completion of the precharge/equalize signal, a write error will occur.

To solve the above problem, the conventional semiconductor memory device disclosed in U.S. Pat. No. 5,091,889 ensured a margin of a write recovery time by precharging data line pair during an address state transition pulse period generated by detecting the address state transition after a write operation, in addition to precharging the data line pair by a signal generating circuit during the write operation. Therefore, even though an invalid address is input, the conventional semiconductor memory device can not write data to memory cell during the period.

SUMMARY OF THE INVENTION

It is an object of the present invention to provide a semiconductor memory device which can protect to write data to a memory cell, even if the invalid data is input.

To achieve the above object, the semiconductor memory device according to the present invention comprises memory cells for storing data, bit line pairs connected to the memory cells and for transmitting the: data, data line pairs for transmitting the data to the bit line pairs, column select transistors for controlling transmission of the data between the bit line pairs and the data line pairs, precharging transistors for precharging the data line pairs, an address state transition detecting means for generating an address state transition detection pulse by detecting state transition of an address signal, a data state transition detection means for generating the data state transition detection pulse by detecting state of the data, a control circuit for enabling the precharging transistors in response to the address state transition detection pulse, the data state transition detection pulse, and a write enable signal.

BRIEF DESCRIPTION OF THE DRAWINGS

The above objects and advantages of the present invention will become more apparent by describing in detail a preferred embodiment thereof with reference to the attached drawings in which:

FIG. 4 is an operational timing diagram of the circuit diagram shown in FIG. 3.

DETAILED DESCRIPTION OF THE PREFERRED EMBODIMENTS

Prior to the construction and operation of the semiconductor memory device according to the present invention, firstly, that of the conventional semiconductor memory device will be described.

Figure 1:
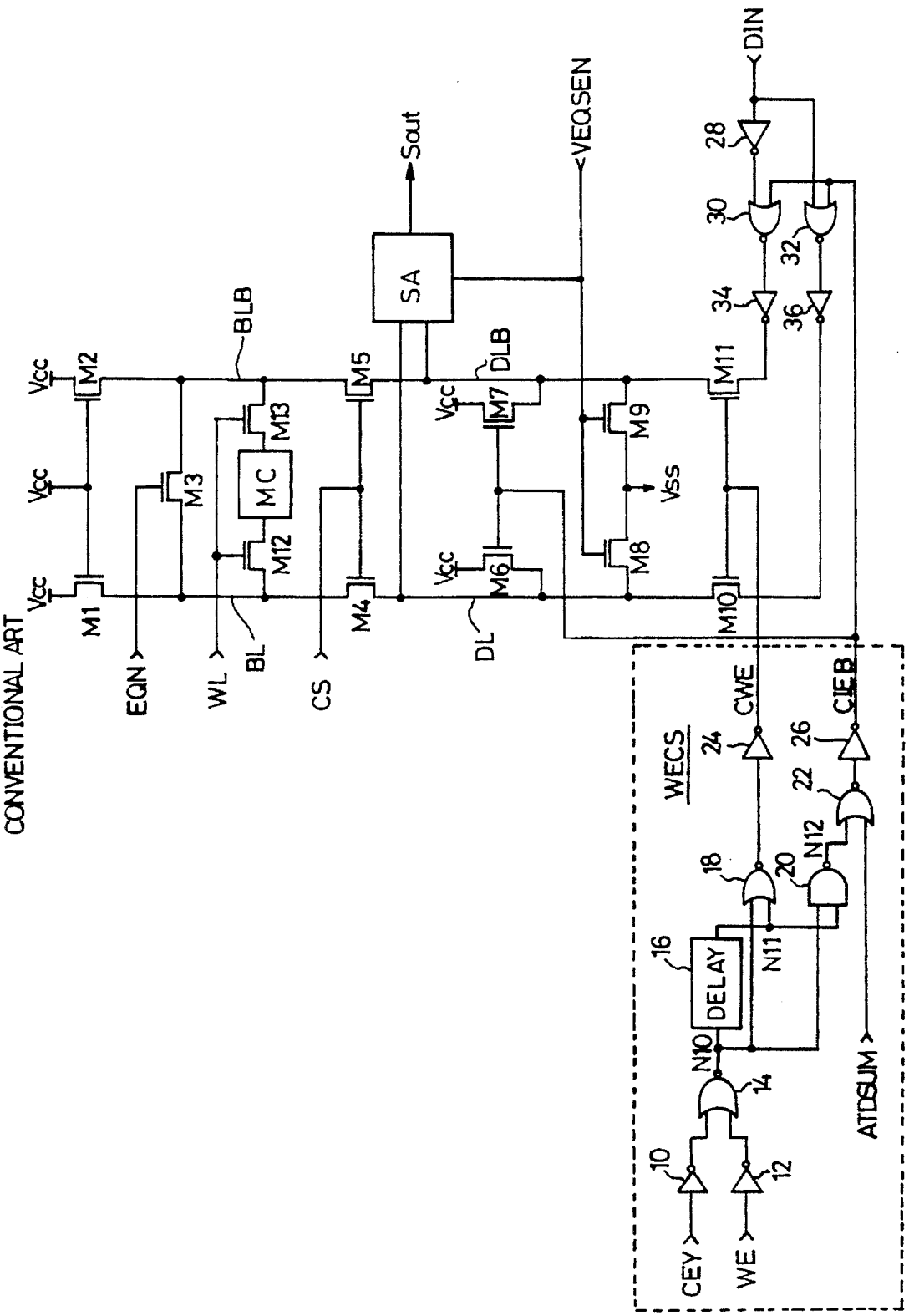
FIG. 1 is a circuit diagram of a conventional semiconductor memory device.

FIG. 1 is a circuit diagram of the conventional semiconductor memory device, is disclosed in U.S. Pat. No. 5,091,889.

In FIG. 1, bit line pair precharge transistors M1, and M2 precharge bit line pair BL, BLB. Equalizing transistor M3 equalizes bit line pair in response to a signal EQN. Switching transistors M12, and M13 are enabled in response to a signal WL for enabling word lines. Memory cell MC stores/outputs data from/to bit line pair through the switching transistors M12, and M13. Column select transistors M4, and M5 is enabled in response to a column select signal generated by a column address signal. Data line pair precharge transistors M6, and M7 precharge data line pair in response to a signal CIEB. Sense amplifier SA amplifies and outputs the signal from data line pair DL, and DLB in response to a sense amplifier enable signal VEQSEN. Pull-down transistor M8, and M9 pulls down the data line pair in response to the signal VEQSEN. Transmission gate M10, and M11 transmits the data inputted in response to a signal CWE to the data line pair. Circuit WECS for generating signals CWE, and CIEB consists of inverters 10, 12, 24, and 26, and NOR gates 14, 18, and 22, NAND gate 20, and delay 16. Inverters 28, 34, and 36, and NOR gate 30, and 32 is for transmitting the data input signal DIN to the data line pair through the transmission gate M10, and M11.

Figure 2:
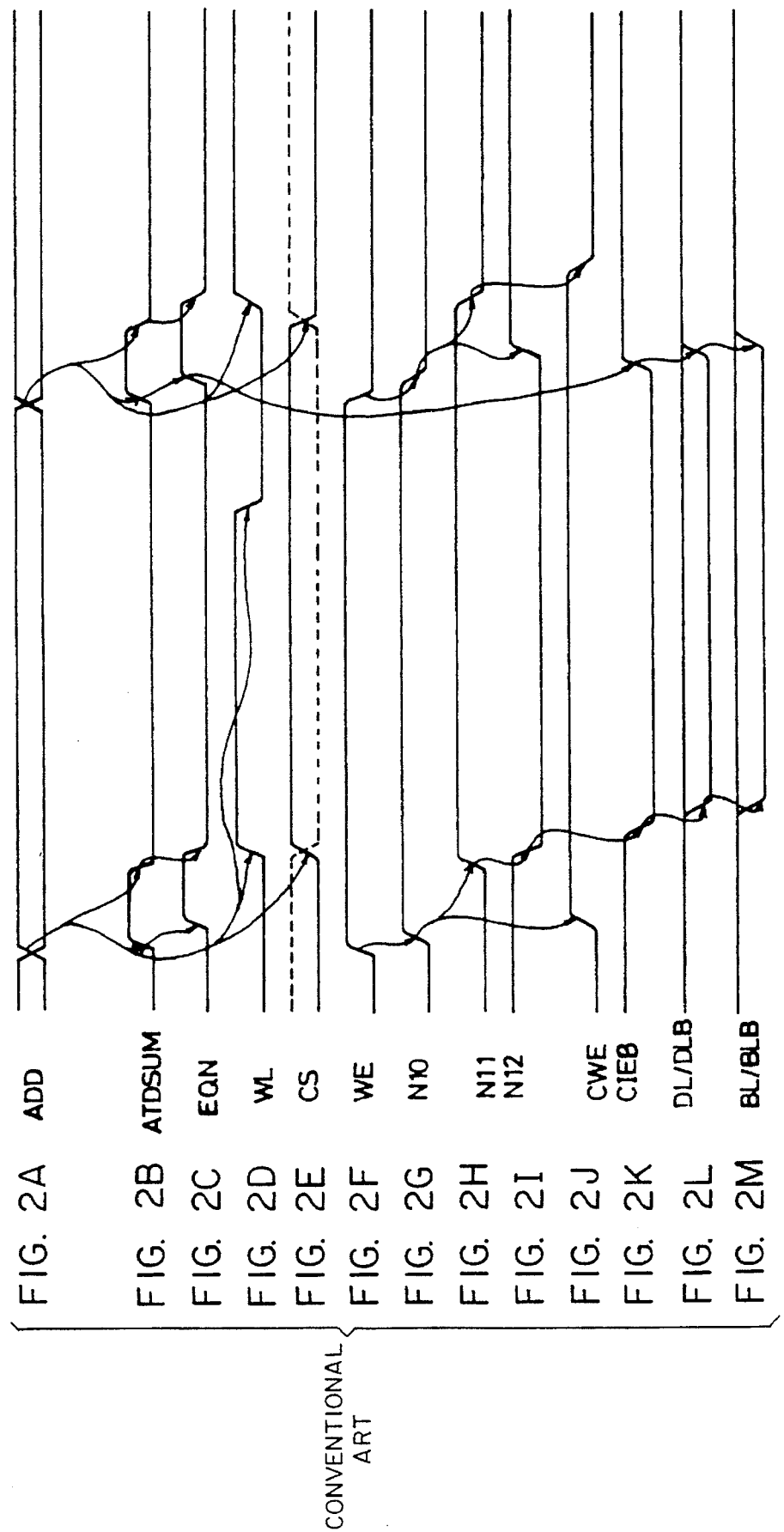
FIG. 2 is an operational timing diagram of the circuit diagram shown in FIG. 1.

FIG. 2 is an operational timing diagram for explaining an operation of the semiconductor memory device shown in FIG. 1.

Address state transition detection signal ATDSUM is generated by detecting the state transition of address signal ADD. Bit line equalizing signal EQN is generated in response to the address state transition detection signal ATDSUM. The signal EQN equalizes the bit line pairs BL, and BLB by applying to transistor M3. The signal WL is generated in response to row address signal ADD. The signal WL enables a memory cell by applying to the memory cell. When the write enable signal WE becomes "high" level, a write operation for writing data to the memory cell is performed. During the write operation, transmission gate M10, and M11 is turned on in case the output signals of NOR gate 18 and inverter 24 by the write enable signal WE transits from "low" level to "high" level, after that, in case a signal CIEB transits from "high" level to "low" level, data is written to the memory cell through transmission gate M10, and M11, and column select transistors M4, and M5. At this time, the signal WL is "high" level state, the sense amplifier enable signal VEQSEN is "low" level state. After completion of the write operation, that is, when the write enable signal, WE becomes "low" level, the signal CIEB becomes "high" level, data line precharge transistors M6, and M7 is turned on, and the output of the inverter 34, 36 becomes "high" level, therefore the data line pair becomes "high" level. After that, the signal CWE becomes "low" level, transmission gate M10, and M11 is turned off, data is not written to the memory cell any longer. However, in case the node N12 is "low" level, the conventional semiconductor memory device ensures a write recovery time by maintaining the signal CIEB to be "high" level by address state transition detection pulse signal ATDSUM generated by detecting the state transition of address signal and precharging data line pair.

That is, the conventional semiconductor memory device can ensure a write recovery time by precharging data line pairs during the pulse time generated by detecting address state transition after completion of the write operation.

Now, the semiconductor memory device of the present invention will be described below.

Figure 3:
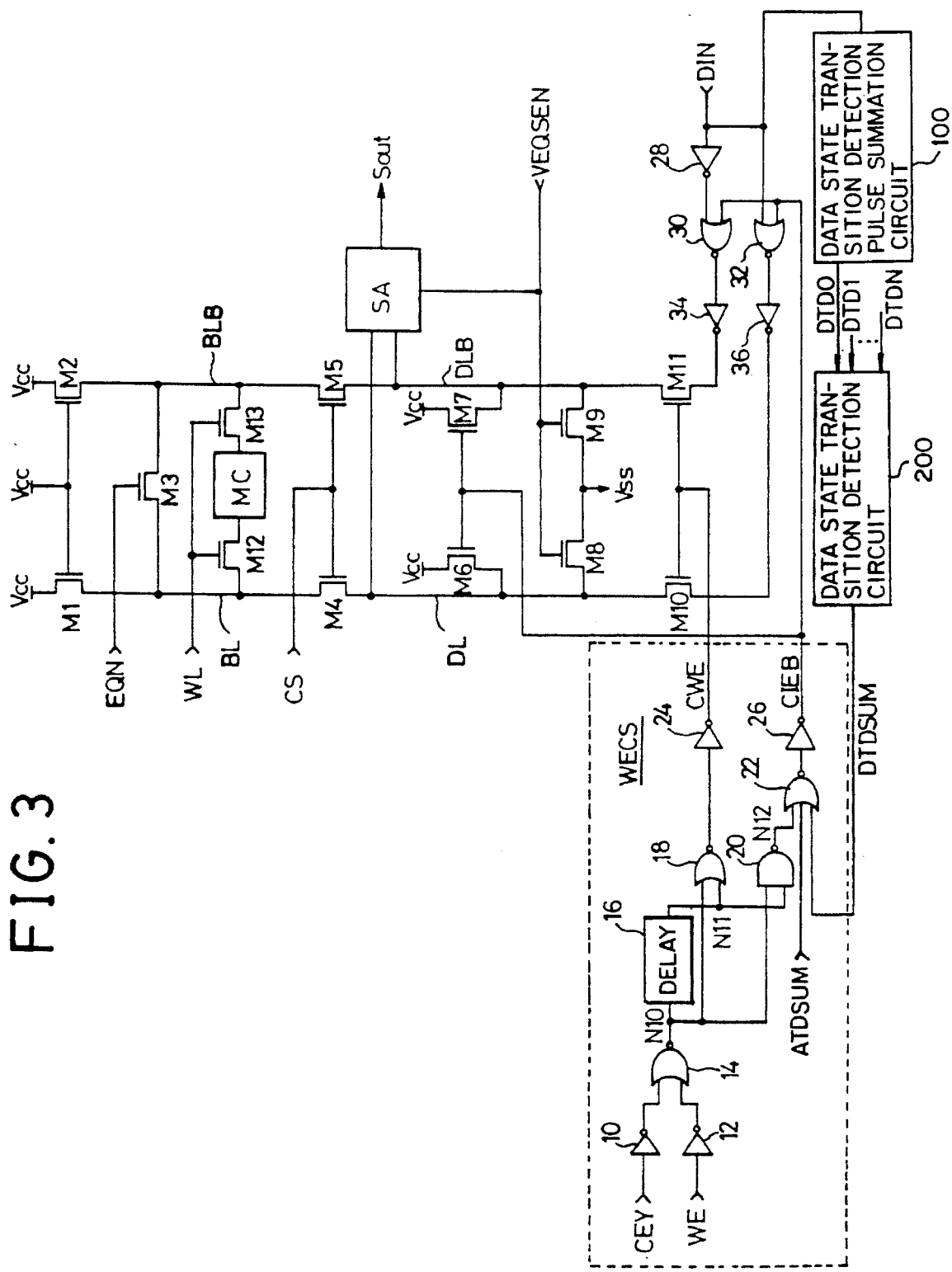
FIG. 3 is a circuit diagram of a semiconductor memory device according to the present invention.

FIG. 3 is a circuit diagram of the semiconductor memory device according to the present invention.

In FIG. 3, data state transition detection circuit 100 generates data state transition detection pulse DTD0 by datainput DIN. Data state transition detection pulse summation circuit 200 ganerates signal DTDSUM by signal DTD0 from data state transition detection circuit 100, and the signals DTD1, . . . , DTDN from the other data state detection circiuts(not shown), inputs the data state transition detection pulse to NOR gate 22. The other circuit construction is equal to the construction of the conventional semiconductor memory device shown in FIG. 1.

FIG. 4 is an operational tinting diagram of the semiconductor memory device shown in FIG. 3.

The operation of the circuit diagram shown in FIG. 3 of will be described by using FIG. 4.

Data state transition detection circuit 100 generates a data state transition detection signal by detecting the state transition of data. Data state transition detection summation signal DTDSUM input to NOR gate 22, and NOR gate 22 generates the signal CIEB for precharging data line pair, and precharges data line pair. That is, in case the node N12 is "low" level, the semiconductor memory device generates data state transition detection pulse DTDSUM and ATDSUM and precharges data line pair by maintaining the signal CIEB to be "high" level during the data state transition detection pulse(and address state transition detection pulse) holds "high" level.

That is to say, The conventional semiconductor memory device for precharging data line pair in case the node N12 is "low" level, ensures a write recovery time by precharging data line pair in response to address state transition detection pulse ATDSUM generated by detecting address state transition after the write operation is completed. However, as shown in FIG. 4, the semiconductor memory device of the present invention can ensure more stable write recovery time and data hold time by adding data state transition detection pulse DTDSUM as a signal for precharging data line pair, and by precharging data line pair by data state transition detection pulse signal DTDSUM even in case address state transition pulse signal ATDSUM transits to "low" level.

Accordingly, the semiconductor memory device of the present invention can ensure enough write recovery time and data hold time by using data state transition detection pulse signal as a signal for precharging data line pair, and can protect an entry of invalid data.

What is claimed is:

1. A semiconductor memory device comprising:

memory cells for storing data;

bit line pairs connected to said memory cells and for transmitting the data;

data line pairs for transmitting the data to said bit line pairs;

column select transistors for controlling transmission of the data between said bit line pairs and said data line pairs;

precharging transistors for precharging said data line pairs;

an address state transition detecting means for generating an address state transition detection pulse by detecting state of an address signal;

a data state transition detection means for generating a data state transition detection pulse by detecting state transition of the data; and a control means for enabling said precharing transistors in response to said address state transition detection pulse, said data state transition detection pulse, and a write enable signal.

\* \* \* \* \*

UNITED STATES PATENT AND TRADEMARK OFFICE
CERTIFICATE OF CORRECTION

PATENT NO. : 5,495,449
DATED : February 27, 1996
INVENTOR(S) : Kyung Y KIM et al.

It is certified that error appears in the above-indentified patent and that said Letters Patent is hereby corrected as shown below:

On the title page, items [75] and [73] should read as follows:

--[75] Inventors: Kyung Y. Kim, Seoul; Jong H. Park, Kyungki-do, both of Rep. of Korea--

--[73] Assignee: Goldstar Electron Co., Ltd., Choongchungbook-do, Korea--

Signed and Sealed this

Sixteenth Day of July, 1996

Attest:

BRUCE LEHMAN

Attesting Officer     Commissioner of Patents and Trademarks